US00RE43081E

(19) United States
(12) Reissued Patent
Goel et al.

(10) Patent Number: US RE43,081 E
(45) Date of Reissued Patent: Jan. 10, 2012

(54) METHOD AND DEVICE FOR CONFIGURATION OF PLDS

(75) Inventors: Ashish Kumar Goel, Varanasi (IN); Davinder Aggarwal, New Delhi (IN)

(73) Assignee: Sicronic Remote KG, LLC, Wilmington, DE (US)

(21) Appl. No.: 12/136,712

(22) Filed: Jun. 10, 2008

Related U.S. Patent Documents

Reissue of:
(64) Patent No.: 7,157,935
Issued: Jan. 2, 2007
Appl. No.: 10/954,981
Filed: Sep. 30, 2004

(30) Foreign Application Priority Data

Oct. 1, 2003 (IN) ..... 1230/DEL/2003

(51) Int. Cl.
*H03K 19/177* (2006.01)

(52) U.S. Cl. ..... 326/39; 326/40; 326/46

(58) Field of Classification Search ..... 326/38–41, 326/46; 365/189.01, 230.01
See application file for complete search history.

(56) References Cited

U.S. PATENT DOCUMENTS

| | | | | |
|---|---|---|---|---|
| 6,237,124 | B1 * | 5/2001 | Plants | 714/763 |
| 6,255,848 | B1 | 7/2001 | Schultz et al. | |
| 6,972,791 | B1 | 12/2005 | Yomeyama | |
| 2004/0015758 | A1 * | 1/2004 | Pathak et al. | 714/725 |
| 2005/0122132 | A1 * | 6/2005 | Leijten-Nowak | 326/39 |
| 2005/0172070 | A1 * | 8/2005 | Aggarwal et al. | 711/109 |
| 2006/0022700 | A1 * | 2/2006 | Goel et al. | 326/8 |

FOREIGN PATENT DOCUMENTS

| | | |
|---|---|---|
| EP | 0911796 | 4/1999 |
| EP | 1320048 | 6/2003 |

* cited by examiner

*Primary Examiner* — Vibol Tan

(57) ABSTRACT

A Programmable Logic Device provides efficient scalability for configuration memory programming while requiring reduced area for implementation. The device includes an array of configuration memory cells, a Vertical Shift Register (VSR) connected to the vertical lines of the array of configuration memory cells, a Select Register (SR) connected to the horizontal lines of the array of configuration memory cells, a Horizontal Shift Register (HSR) providing the enable input to the Select Register (SR), and a Configuration State Machine (CSM) which synchronizes the operations of the VSR, SR and HSR.

28 Claims, 2 Drawing Sheets

METHOD AND DEVICE FOR CONFIGURATION OF PLDS

Matter enclosed in heavy brackets [ ] appears in the original patent but forms no part of this reissue specification; matter printed in italics indicates the additions made by reissue.

PRIORITY CLAIM

The present application claims priority from Indian Application for Patent No. 1230/Del/2003 filed Oct. 1, 2003, the disclosure of which is hereby incorporated by reference.

BACKGROUND OF THE INVENTION

1. Technical Field of the Invention

The present invention relates to Programmable Logic Devices (PLDs) and more particularly to a device and method for configuration of PLDs.

2. Description of Related Art

A typical field programmable gate array (FPGA) comprises an array of configuration memory cells, configuration control elements and a matrix of logic and I/O blocks. Different digital circuits can be realized on an FPGA by configuring its memory cell array and control elements.

FIG. 1 shows a block diagram of a typical FPGA 100 comprising an array of configuration memory cells 1.1 (also referred to as the core or latch array) connected to a Vertical Shift Register (VSR) 1.2, a select register (SR) 1.3, and a horizontal decoder 1.4 providing its output to the SR 1.3. The decoder 1.4 receives its input from a configuration state machine 1.5 which also provides input to VSR 1.2 and incorporates a counter register 1.5.1 and index register 1.5.2.

An FPGA is typically configured as follows: a frame of data is loaded into the VSR 1.2. For a complete frame of data that is loaded in the VSR 1.2, the configuration state machine 1.5 and the selection register 1.3 enable a selection line for shifting the data column from VSR 1.2 to a particular column of the configuration memory latch array 1.1 and on completion of the shift operation the selection lines are disabled. The next frame of data is then loaded in the VSR 1.2 and the process of selecting and shifting is repeated until the entire latch array 1.1 is configured.

The configuration state machine 1.5 supports two types of configuration schemes. One is a normal configuration, in which the entire configuration latch array 1.1 matrix is loaded. The other scheme is the partial configuration scheme, in which only a part of configuration latch array 1.1 matrix needs to be reloaded. In order to support both schemes, the configuration state machine includes two registers namely count register 1.5.1 and the index register 1.5.2 as shown in FIG. 1. In case of the normal operation for configuration, all the configuration latches 1.1 are first initialized to the reset value, and then the count register 1.5.1 is initialized to the first location. The index register 1.5.2 is initialized to the maximum number of select lines in the configuration latch matrix. The data is loaded into the VSR until the VSR is full. After the VSR is full one of the select lines is enabled depending on the value stored in the count register, thus transferring the data from the VSR register into the selected column of configuration latches.

After the data has been written onto the latches 1.1, the value of counter register [1.3] *1.5.1* is incremented and the value in the index register [1.4] *1.5.2* is decremented. This process continues until the value stored in the index is zero. After completion of the configuration process the startup sequence is initiated.

As described above, the index register [1.5.1] *1.5.2* stores the value of the columns of onfiguration latches 1.1 to be enabled. Thus in case of partial configuration the value stored in this register determines the number of columns to be reprogrammed.

Decoder 1.4 and a select register 1.3 are used for enabling the column of latches. The line to be enabled is the decoded output of count register 1.5.1. Since the number of column lines of configuration latches 1.1 is very high (of the order of 1000) the complexity of decoder 1.4 is very high, and the placement and routing of the decoder 1.4 is also complex. The area consumed in making such a large decoder 1.4 is also high.

A further problem associated with this technique is the difficulty in scalability. Any modification in the size of the array requires a change in the size of the decoder.

Thus, there is a need to develop a technique that provides a simple method of enabling the column of configuration latches and also reduces area, complexity and routing requirements of the decoder.

SUMMARY OF THE INVENTION

Embodiments of the present invention address the foregoing and other drawbacks of the prior art.

In accordance with an embodiment of the present invention, a simplified method and device are provided for configuring FPGAs. In accordance with this method and device, the decoder of configuration memories used in FPGAs is replaced with a horizontal shift register. This reduces the complexities associated with the decoder hence simplifying configuration process.

Accordingly, an embodiment of the present invention provides a Programmable Logic Device providing efficient scalability for configuration memory programming while requiring reduced area for implementation. The device comprises an array of configuration memory cells, a Vertical Shift Register (VSR) connected to the vertical lines of the array of configuration memory cells, a Select Register (SR) connected to the horizontal lines of the array of configuration memory cells, a Horizontal Shift Register (HSR) providing the enable input to the Select Register (SR), and a Configuration State Machine (CSM) which synchronizes the operations of the VSR, SR and HSR.

The Configuration State Machine comprises an index register that specifies the number of columns of the configuration array that are to be enabled, an increment register that contains the number of shifts required in the HSR prior to enabling the column, and a count address register that provides a count of the number of programmed columns.

The Horizontal Shift Register comprises a plurality of flip-flops connected in series to form a serial shift register with a common clock signal and initialization signal that sets the first flip-flop and clears the remaining flip-flops at the start of the configuration process.

An embodiment of the present invention also provides a method for providing efficient scalability with minimum area overhead in configuring the configuration memory of a Programmable Logic Device (PLD). The method comprises shifting in the configuration data of a particular column of the configuration memory, selecting said particular column by shifting a selection bit to its enable signal bus, enabling the selected column to load the configuration data, and repeating the foregoing process steps for each desired column of the configuration memory.

In accordance with an embodiment of the invention, a device includes a configurable memory latch array and a vertical shift register supplying configuration data to rows of the array. The device further includes a circuit for moving the configuration data from the vertical shift register to one selected column of the array for storage, the circuit operating without the use of a horizontal decoding circuit. More specifically, in an embodiment of the present invention, the circuit uses a horizontal shift register in place of a horizontal decoding circuit to make column selections.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 2:
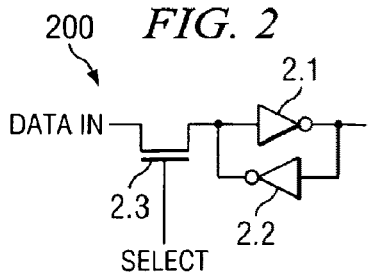
FIG. 2 is a diagram of a configuration latch.

FIG. 2 shows a schematic block diagram of the configuration latches 200. The memory latch 200 is formed by cross coupling two inverters 2.1 and 2.2. This cross coupled arrangement is connected to at least one transistor 2.3 which has a select line connected to its control terminal. When this select line is active high the data at the input is applied to the latch. This latch is used to store the configuration data. The output of the latch is further used to control the functionality of the FPGA. These latch cells are arranged in a number of columns in the configuration latch matrix.

Figure 3:
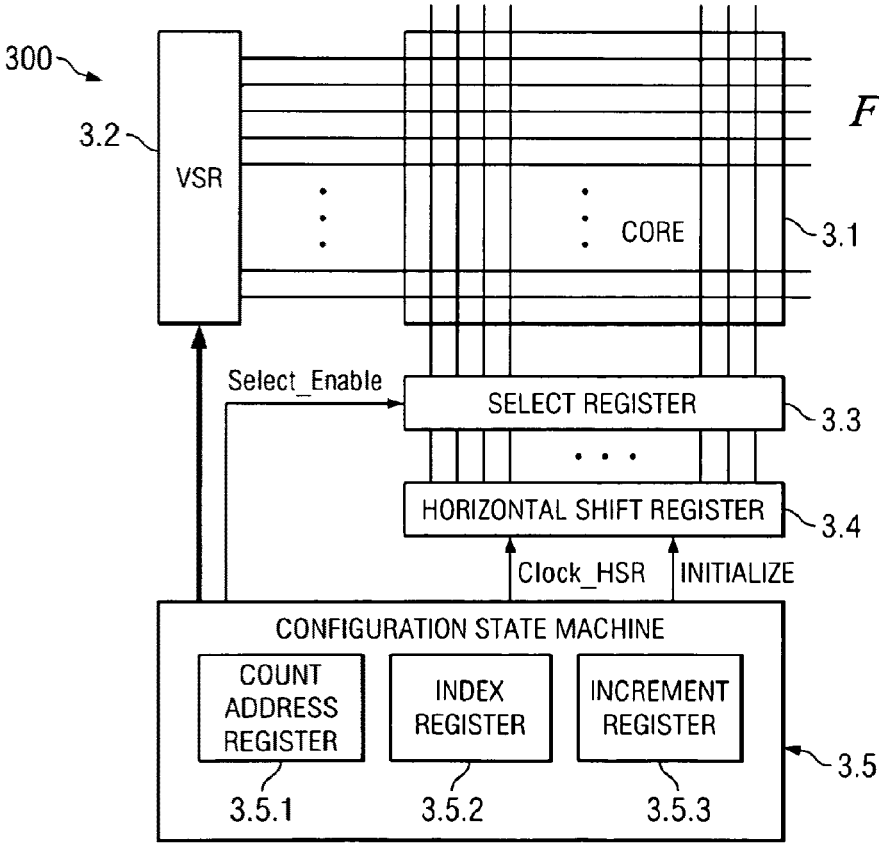
FIG. 3 is a schematic block diagram of one of the possible embodiment of the FPGA in accordance with the present invention.

FIG. 3 shows a schematic block diagram of one of the possible embodiments of the FPGA 300 in accordance with the present invention. The FPGA according to the present invention comprises of an array of configuration memory cells 3.1 connected to a Vertical Shift Register (VSR) 3.2 and a select register (SR) 3.3. It further includes a horizontal shift register 3.4 providing its output to the SR 3.3 and receiving input from a configuration state machine 3.5 which also provides an data input to VSR 3.2 and has a counter register 3.5.1, index register 3.5.2 and a increment register 3.5.3. The registers 3.2, 3.3, 3.4 receive their control signals from the state machine counter.

Figure 1:
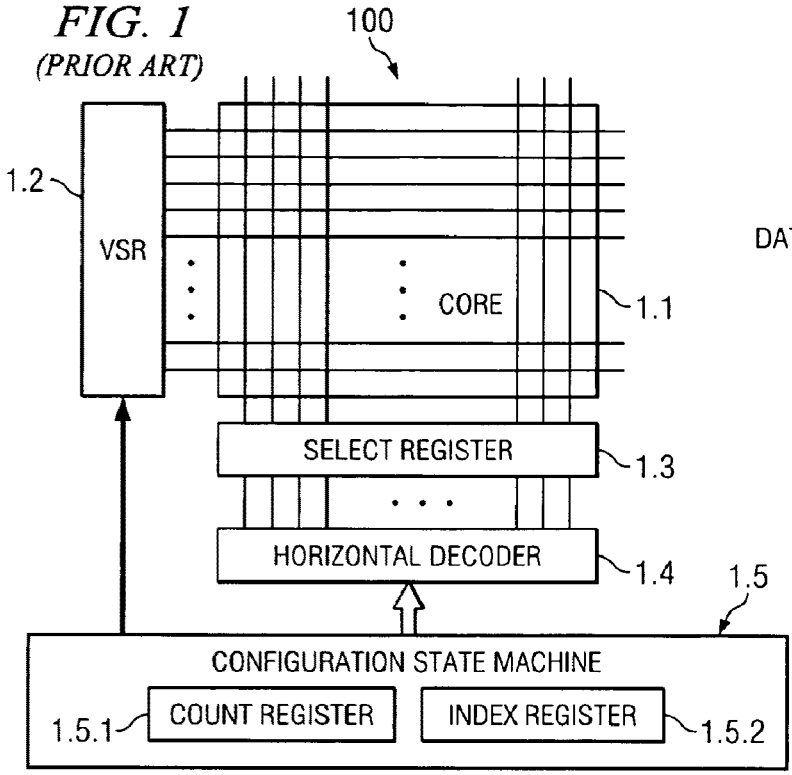
FIG. 1 (PRIOR ART)
FIG. 1, previously described, is a schematic block diagram of a conventional FPGA.

The function of the registers VSR 3.2, select register 3.3, index register 3.5.2 and the count address register 3.5.1 are similar to the corresponding registers 1.2, 1.3, 1.5.2, and 1.5.1 of FIG. 1 as described above. The decoder 1.4 of FIG. 1 has been replaced by a Horizontal Shift Register (HSR) 3.4 to reduce the complexities associated with the decoder. The HSR 3.4 receives inputs from the configuration state machine 3.5 and provides control signals to the selection register 3.3. The configuration state machine 3.5 of the present embodiment has an index register 3.5.2 which registers the number of configuration lines to be enabled from the current position of the Horizontal shift register. The index register 3.5.2 is loaded in both the normal and partial configuration cases. The increment register 3.5.3 is used for registering the count value of the number of HSR 3.4 shifts that are required before enabling the first line of the HSR. This register enables the partial configuration of the memory in an efficient manner since it allows the flexibility of configuration of the memory starting from any column of the memory. Further, the state machine 3.5 has been provided with a count address register 3.5.1, which registers a count for each shift operation completed and indicates the completion of the configuration.

The index 3.5.2 and increment 3.5.2 registers are loaded before the configuration starts. In case of partial configuration, the registers are loaded for each set of regular frames that are to be configured.

There are two sets of registers which control the enabling of the select line of the configuration latches—namely the HSR (Horizontal Shift Register) and the select register. The HSR has one set bit corresponding to the column of configuration latch matrix which has to be enabled. The column is finally enabled by the enabling of the select register, by the configuration state machine.

Figure 4:
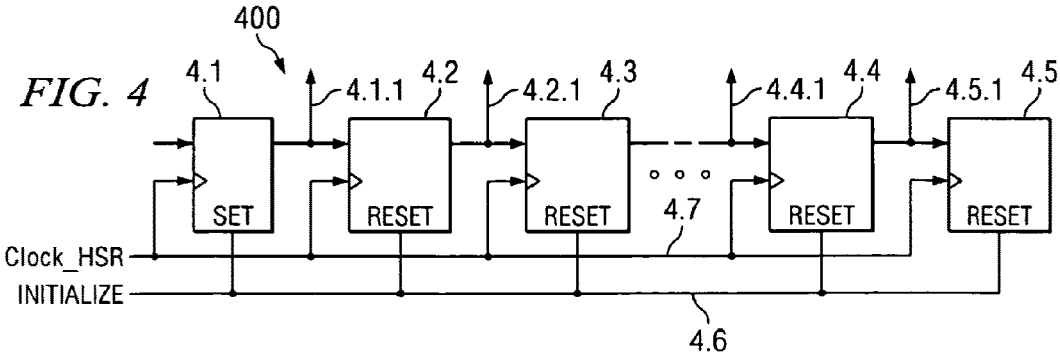
FIG. 4 illustrates an embodiment of a horizontal shift register in accordance with the present invention.

FIG. 4 shows the internal structure of the Horizontal shift register 400. The HSR comprises a plurality of registers 4.1, 4.2, 4.3, 4.4, 4.5 connected in series. All these registers receive an initialize signal 4.6 and a clock signal (clock-HSR) 4.7 from the configuration state machine. The initialize signal 4.6 is generated at the start of the configuration process. On initialization the first register 4.1 is set while the remainder are reset. The set bit of register 4.1 then is shifted at the clock edge thus providing a shifting signal at outputs 4.1.1, 4.2.1, 4.3.1, 4.4.1, and 4.5.1.

This arrangement provides a simple and flexible design of the HSR that is easily scalable since the size of the memory array can be easily enhanced by adding or removing a register from the HSR.

Figure 5:
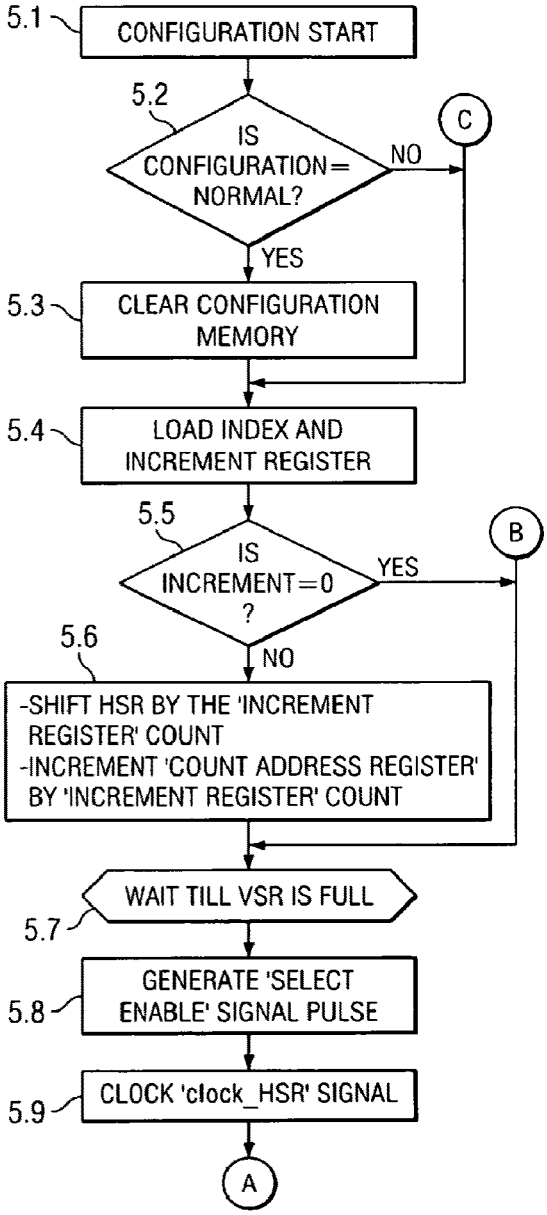
FIGS. 5 and 6 illustrate a flow diagram for configuring a latch according to the present invention.
Figure 6:
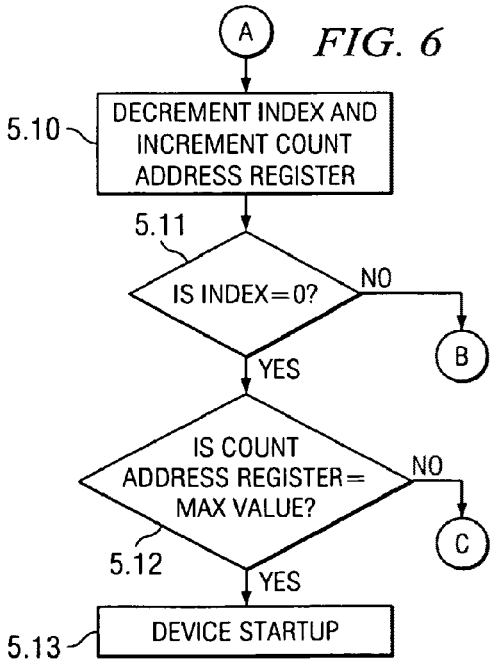

FIGS. 5 and 6 show a flow diagram 500 for configuring the latches according to the present invention. The method described below for configuration of FPGA supports both Partial and Normal configuration without much alteration.

In the first step 5.1 the configuration is started and then the configuration mode is checked. For the case of normal configuration 5.2 the entire memory is cleared 5.3 and the index and increment registers are loaded 5.4 whereas for the partial mode configuration directly the index and increment registers are loaded. In the next step 5.5 it is checked if the increment register is zero, for the case when the increment register is not zero the HSR is shifted by the increment register count and address register is incremented by the increment register count 5.6. Once the VSR is full 5.7, if increment generated was zero then the select enable signal pulse is generated 5.7 and clock signal clock_HSR is initiated 5.8 and index and increment count address register are decremented 5.9. If index register is not zero 5.10 at this stage then steps 5.7 to 5.10 are repeated otherwise, if the count address register is maximum then steps 5.4 to 5.10 are repeated or the configuration is signaled as complete.

Normal configuration: for normal configuration mode the index register value is always equal to the column count in the configuration matrix and the value for increment register is always zero. Thus the configuration starts from the first column and proceeds until the last Column where both conditions of "index and count address register" become true.

Partial configuration: in the case of partial configuration the values of index and increment register will vary the column sets are defined by "start value" (increment) and columns to be enabled from "start value (index)". After each set of configuration columns is loaded, the value in count address register is checked for maximum value. If the maximum value has not been reached another set of configuration data may require to be loaded. Once the count address register reaches maximum value the start up is initiated.

This invention is not to be considered limited to the specific examples chosen for purposes of disclosure, but rather to cover all changes and modifications, which do not constitute departures from the permissible scope of the present invention. The invention is therefore not limited by the description contained herein or by the drawings, but only by the claims.

What is claimed is:

1. A Programmable Logic Device providing efficient scalability for configuration memory programming while requiring reduced area for implementation, comprising:

an array of configuration memory cells;

a Vertical Shift Register (VSR) connected to [the] vertical lines of the array of configuration memory cells;

a Select Register (SR) connected to [the] horizontal lines of the array of configuration memory cells;

a Horizontal Shift Register (HSR) providing [the] *an* enable input to the Select Register (SR); and a Configuration State Machine (CSM) which synchronizes the operations of the VSR, SR and HSR.

2. The Programmable Logic Device of claim 1 wherein the Configuration State Machine comprises:

an index register that specifies [the] *a* number of columns of the configuration array that are to be enabled;

an increment register that contains [the] *a* number of shifts required in the HSR prior to enabling the column; and a count address register that provides a count of the number of programmed columns.

3. The Programmable Logic Device of claim 1 wherein the Horizontal Shift Register comprises a plurality of flip-flops connected in series to form a serial shift register with a common clock signal and initialization signal that sets the first flip-flop and clears the remaining flip-flops at the start of the configuration process.

4. A device, comprising:

a configurable memory latch array;

a vertical shift register supplying configuration data to rows of the array; and a circuit for moving the configuration data from the vertical shift register to [one] *a* selected column of the array for storage, the circuit comprising:

a horizontal select register operable to select columns within the array;

a horizontal shift register generating control signals driving horizontal select register operation; and a configuration state machine controlling operation of the horizontal shift register.

5. The device of claim 4 wherein the configuration state machine comprises:

an index register which registers a number of columns to be enabled from a current column specified by the horizontal shift register;

an increment register which registers a number of shifts until selection of a column by the horizontal shift register; and a count address register which registers a count for each completed operation of moving configuration data from the vertical shift register.

6. The device of claim 4 wherein the configuration state machine comprises:

an index register specifying a number of columns of the array that are to be loaded with configuration data;

an increment register specifying a number of shifts required by the horizontal shift register before enabling a desired column; and a count address register specifying a count of completed operations to move configuration data from the vertical shift register.

7. A device comprising:

a configurable memory latch array;

a vertical shift register supplying configuration data to rows of the array;

a horizontal shift register; and a configuration state machine including;

an index register which registers a number of columns to be enabled from a current column specified by the horizontal shift register;

an increment register which registers a number of shifts until selection of a column by the horizontal shift register; and a count address register which registers a count for each completed operation of moving configuration data from the vertical shift register.

8. A device comprising:

a configurable memory latch array;

a vertical shift register supplying configuration data to rows of the array;

a horizontal shift register; and a configuration state machine including:

an index register specifying a number of columns of the array that are to be loaded with configuration data;

an increment register specifying a number of shifts required by the horizontal shift register before enabling a desired column; and a count address register specifying a count of completed operations to move configuration data from the vertical shift register.

*9. A Programmable Logic Device comprising:*

*a select register;*

*a horizontal shift register configured to provide an enable input to the select register; and*

*a configuration state machine configured to control operation of the horizontal shift register.*

*10. The Programmable Logic Device as recited in claim 9, wherein the configuration state machine includes an increment register that is configured to contain a number of shifts used by the horizontal shift register prior to enabling a column in a configurable memory latch array on the programmable logic device.*

*11. The Programmable Logic Device as recited in claim 9, wherein the configuration state machine comprises:*

*an index register configured to specify a number of columns of a configuration array that are to be enabled;*

*an increment register configured to contain a number of shifts used by the horizontal shift register prior to enabling the column; and*

*a count address register configured to provide a count of a number of programmed columns.*

*12. The Programmable Logic Device as recited in claim 9, wherein the horizontal shift register comprises a plurality of flip-flops connected in series to form a serial shift register with a common clock signal and initialization signal that is configured to set a first flip-flop and clear remaining flip-flops at the start of a configuration process.*

*13. The Programmable Logic Device as recited in claim 9, further comprising an array of configuration memory cells operably associated with the select register.*

*14. The Programmable Logic Device as recited in claim 9, further comprising:*

*an array of configuration memory cells operably associated with the select register; and*

*a vertical shift register operably associated with the array of configuration memory cells.*

*15. The Programmable Logic Device as recited in claim 14, wherein the vertical shift register is connected to vertical lines of the array of configuration memory cells.*

*16. The Programmable Logic Device as recited in claim 13, wherein the select register is configured to select columns within the array of configuration memory cells.*

*17. The Programmable Logic Device as recited in claim 13, wherein the select register is connected to horizontal lines of the array of configuration memory cells.*

*18. A Programmable Logic Device comprising:*

*a configuration state machine; and*

*a horizontal shift register comprising a plurality of registers, wherein the horizontal shift register is scalably configurable to remove or add one or more of the plurality of registers, and wherein the plurality of registers are configured to receive an initialize signal and a clock signal from the configuration state machine.*

*19. The Programmable Logic Device as recited in claim 18, wherein the initialize signal is configured to set a first register in the plurality of registers and clear remaining registers in the plurality of registers.*

*20. The Programmable Logic Device as recited in claim 19, wherein the plurality of registers comprise a plurality of flip-flops connected in series to form a serial shift register with a common clock signal and initialization signal that is configured to set a first flip-flop and clear remaining flip-flops at the start of a configuration process.*

*21. The Programmable Logic Device as recited in claim 18, wherein the configuration state machine is configured to control the operation of the horizontal shift register.*

*22. The Programmable Logic Device as recited in claim 18, further comprising a select register, wherein the configuration state machine is configured to control the operation of the horizontal shift register, and wherein the horizontal shift register is configured to provide an enable input to the select register.*

*23. A method comprising:*

*changing a memory array size of a Programmable Logic Device by performing one or more of:*

*adding a register to a horizontal shift register of the Programmable Logic Device, or*

*removing a register from the horizontal shift register;*

*wherein the Programmable Logic Device includes a configuration state machine.*

*24. A method for configuring a Programmable Logic Device comprising:*

*clearing a memory associated with the Programmable Logic Device;*

*loading contents of index and increment registers into the memory;*

*shifting a horizontal shift register by a value of the increment register;*

*incrementing a count address register by the value of the increment register;*

*decrementing the value of the increment register by a value of one;*

*repeating said shifting, incrementing and decrementing until the value of the increment register is equal to zero;*

*generating a select enable signal from a configuration state machine to the select register;*

*initiating the horizontal shift register by sending a clock signal from the configuration state machine to the horizontal shift register; and*

*decrementing values of the index and increment registers by one.*

*25. A method for configuring a Programmable Logic Device comprising:*

*loading contents of index and increment registers into a memory associated with the Programmable Logic Device;*

*shifting a horizontal shift register by a value of the increment register;*

*incrementing a count address register by the value of the increment register;*

*decrementing the value of the increment register by a value of one;*

*repeating said shifting, incrementing, and decrementing until the value of the increment register is equal to zero;*

*generating a select enable signal from a configuration state machine to a select register;*

*initiating the horizontal shift register by sending a clock signal from the configuration state machine to the horizontal shift register; and*

*decrementing values of the index and increment registers by one.*

*26. A device comprising:*

*a configurable memory latch array;*

*a vertical shift register supplying configuration data to rows of the array;*

*a circuit configured to move the configuration data from the vertical shift register to a selected column of the array for storage, the circuit including a scalable plurality of registers, wherein the circuit is scalable by adding or removing one or more of the plurality of registers; and*

*a configuration state machine configured to control operation of the circuit, the configuration state machine including an index register, an increment register, and a count address register.*

*27. A Programmable Logic Device comprising:*

*a horizontal shift register;*

*a configuration state machine configured to control the horizontal shift register; and*

*means for enabling the Horizontal Shift Register to provide an enable input to an associated Select Register.*

*28. A Programmable Logic Device comprising:*

*a configurable memory latch array including a plurality of columns;*

*a horizontal shift register;*

*a configuration state machine including an increment register configured to register a count value of a number of horizontal shift register shifts that are used before enabling a first line of the horizontal shift register, wherein the increment register is configured to enable partial configuration of the configurable memory latch array starting from any column in the plurality of columns in the memory latch array.*

* * * * *

UNITED STATES PATENT AND TRADEMARK OFFICE

CERTIFICATE OF CORRECTION

PATENT NO. : RE43,081 E
APPLICATION NO. : 12/136712
DATED : January 10, 2012
INVENTOR(S) : Goel et al.

It is certified that error appears in the above-identified patent and that said Letters Patent is hereby corrected as shown below:

Column 6, line 12, in Claim 7, delete "including;" and insert -- including: --.

Column 7, line 47, in Claim 23, delete "*register;*" and insert -- *register,* --.

Signed and Sealed this
Third Day of July, 2012

David J. Kappos

David J. Kappos
*Director of the United States Patent and Trademark Office*